(12) United States Patent
Kajigaya

(10) Patent No.: US 9,984,739 B2
(45) Date of Patent: May 29, 2018

(54) APPARATUSES AND METHODS FOR CONTROLLING WORDLINES AND SENSE AMPLIFIERS

(71) Applicant: Micron Technology, Inc., Boise, ID (US)

(72) Inventor: Kazuhiko Kajigaya, Iruma (JP)

(73) Assignee: Micron Technology, Inc., Boise, ID (US)

( * ) Notice: Subject to any disclaimer, the term of this patent is extended or adjusted under 35 U.S.C. 154(b) by 0 days. days.

(21) Appl. No.: 15/429,021

(22) Filed: Feb. 9, 2017

(65) Prior Publication Data

US 2017/0301389 A1  Oct. 19, 2017

Related U.S. Application Data

(63) Continuation of application No. 15/099,443, filed on Apr. 14, 2016, now Pat. No. 9,601,183.

(51) Int. Cl.
| | |
|---|---|
| *G11C 8/00* | (2006.01) |
| *G11C 11/4076* | (2006.01) |
| *G11C 11/408* | (2006.01) |
| *G11C 11/4091* | (2006.01) |
| *G06F 13/16* | (2006.01) |

(52) U.S. Cl.
CPC ........ *G11C 11/4076* (2013.01); *G06F 13/161* (2013.01); *G11C 11/4085* (2013.01); *G11C 11/4087* (2013.01); *G11C 11/4091* (2013.01)

(58) Field of Classification Search
CPC ............ G11C 11/4076; G11C 11/4085; G11C 11/4087; G11C 11/4091
USPC .............................. 365/230.06, 63, 193, 203
See application file for complete search history.

(56) References Cited

U.S. PATENT DOCUMENTS

| | | | |
|---|---|---|---|
| 8,203,904 B2 | 6/2012 | Jang et al. | |
| 8,804,446 B2 * | 8/2014 | Okahiro | G11C 7/08 |
| | | | 365/203 |
| 9,601,183 B1 | 3/2017 | Kajigaya | |

(Continued)

FOREIGN PATENT DOCUMENTS

WO    2017180301 A1    10/2017

OTHER PUBLICATIONS

Cooper-Balis, E. et al., "Fine-Grained Activation for Power Reduction in DRAM", Micro, vol. 30, No. 3, pp. 34-47, 2010.

(Continued)

*Primary Examiner* — Son Dinh
(74) *Attorney, Agent, or Firm* — Dorsey & Whitney LLP

(57) ABSTRACT

Apparatuses and methods for controlling word lines and sense amplifiers in a semiconductor device are described. An example apparatus includes: a sub word line selection signal decoder which activates at least one of a plurality of sub word selection signals responsive to row address signals; a column segment selection signal decoder which activates at least one of a plurality of column segment signals responsive to a portion of column address signals and a portion of the row address signals; a column segment selection circuit which activates at least one of a plurality of column-subword selection signals responsive to the activated column segment signal and the activated sub word selection signal; and a sub word line driver which activates at least one of a plurality of sub word lines responsive to an activated main word line and the activated sub word selection signal.

20 Claims, 15 Drawing Sheets

(56) References Cited

U.S. PATENT DOCUMENTS

| | | |
|---|---|---|
| 2002/0001895 A1 | 1/2002 | Kitamoto et al. |
| 2005/0068840 A1 | 3/2005 | Park et al. |
| 2006/0044924 A1 | 3/2006 | Wada et al. |
| 2006/0187721 A1 | 8/2006 | Freebern |
| 2010/0165769 A1* | 7/2010 | Kuroki ................ G11C 11/4076 365/203 |
| 2013/0135915 A1 | 5/2013 | Kim |
| 2015/0098260 A1 | 4/2015 | Ohgami |

OTHER PUBLICATIONS

Zhang, T. et al., "Half-DRAM: a High-bandwidth and Low-power DRAM Architecture from the Rethinking of Fine-grained Activation", International Symposium on Computer Architecture, 2014.
International Search Report and Written Opinion dated Jun. 2, 2017 for PCT Application No. PCT/US2017/023548, pp. all.

* cited by examiner

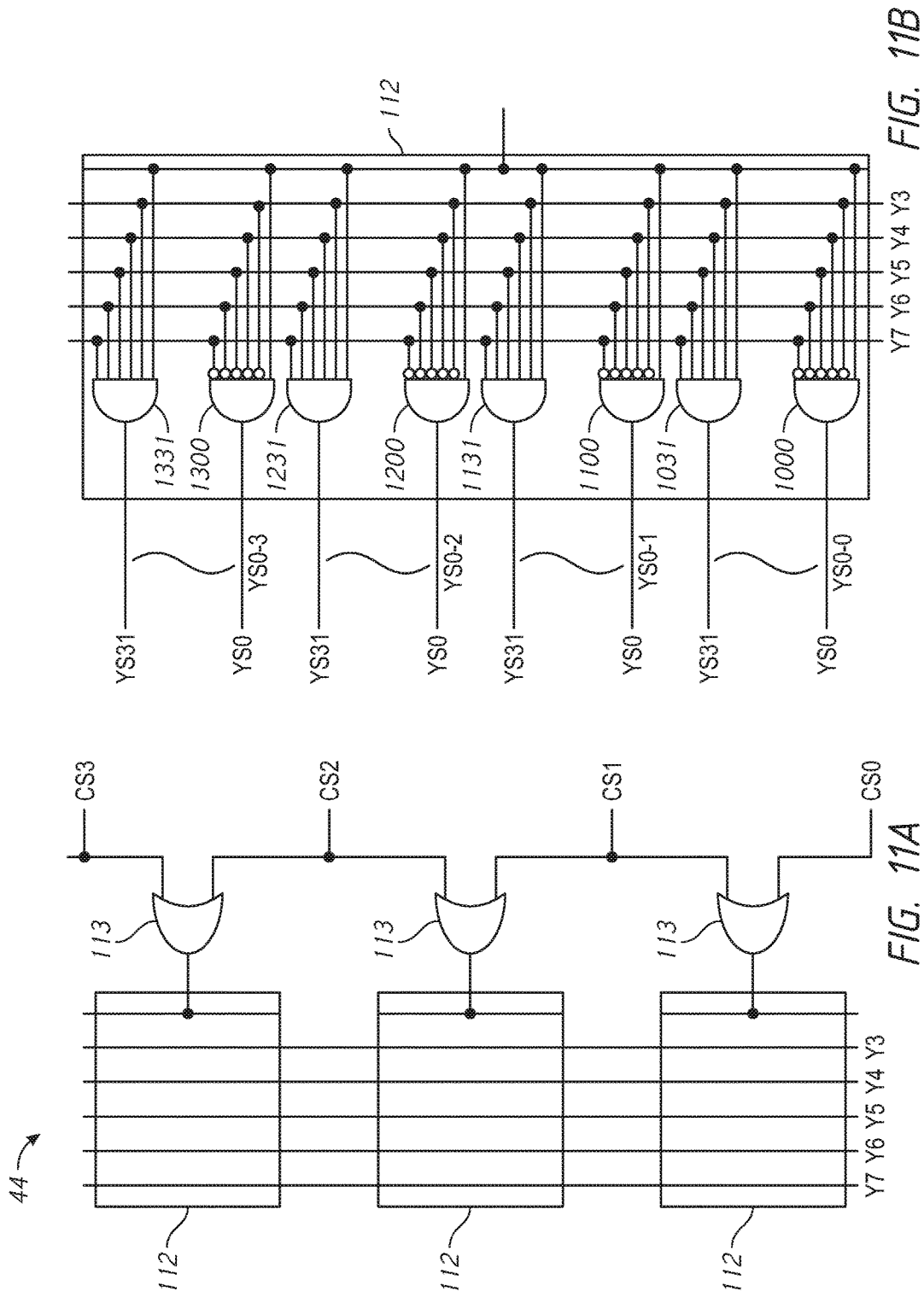

APPARATUSES AND METHODS FOR CONTROLLING WORDLINES AND SENSE AMPLIFIERS

CROSS REFERENCE TO RELATED APPLICATION

This application is a continuation of U.S. application Ser. No. 15/099,443 filed Apr. 14, 2016, and issued as U.S. Pat. No. 9,601,183 on Mar. 21, 2017.The aforementioned application and issued patent are incorporated herein by reference, in their entirety, for any purpose.

BACKGROUND

High speed memory access, and reduced power consumption are features that are demanded from semiconductor devices. In recent years, a computer system that adopted multi-core processors and simultaneous execution of a plurality of applications has resulted in lower spatial locality of access patterns to a memory device serving as a main memory (e.g., dynamic random access memory (DRAM)) and more random access patterns. A typical access pattern to the DRAM repeats bank activation, read access or write access, and bank precharge in the order. When different banks are continuously accessed by bank interleaving using the access pattern mentioned above, simultaneous bank activation to the different banks may cause peak power consumption to exceed an acceptable threshold. In order to avoid such excess power consumption, a number of banks to be accessed simultaneously may be limited (e.g., maximum of four). However, the limitation of the number of banks to be accessed may lower access efficiency of the DRAM.

Some techniques to reduce the activation/precharge power consumption have been disclosed. For example, Cooper-Balis and Jacob proposed a fine-grained activation technique that uses an additive latency and a posted column-address strobe (posted-CAS) command to acquire a column address to be accessed while a bank is active. Word lines having a length shorter than ordinary word lines including the column address may be activated only with a corresponding sense amplifier. In this manner, power consumption while the bank is active may be reduced. However, the fine-grained activation technique may induce severe performance or area overhead due to a reduced data bandwidth. Zhang, et al. discloses a Half-DRAM technique that avoids a bandwidth reduction of data to address the problems of the fine-grain activation technique of Cooper-Balis and Jacob. The Half-DRAM technique enables the fine-grained activation with full data bandwidth by leveraging the "1RD-2HFF" structure and by exploiting sub-array level parallelism.

In another example, sub word line drivers of the DRAM may be in a staggered arrangement in column segments. FIG. 1 is a schematic diagram of column segments in an example dynamic random-access memory (DRAM). One block is divided into a plurality of column segments that may be matrices MAT0 to MAT7. Sub word line drivers are disposed between the respective matrices and on upper and lower sides of the block. For example, FIG. 1 shows a configuration in which column addresses Y9 and Y8 are used as column segments. Each block is divided into four column segments, where each column segment includes two matrices and a corresponding sub word line is selected and activated. Due to a small pitch of the sub word lines, a sub word line driver layout includes the sub word line drivers with a pitch twice as large as the pitch of the sub word lines.

As shown in FIG. 1, a sub word line selection range selected by using Y9 and Y8 may correspond to one column segment. For example, the sub word line selection range may be two rows of the sub word line drivers respectively disposed between MAT1 and MAT2, between the MAT3 and MAT4, as well as between the MAT5 and MAT6, in order to keep each sub word line length. This configuration of having two rows of the sub word line drivers at three locations in each block, however, may increase a chip area.

BRIEF DESCRIPTION OF THE DRAWINGS

FIG. 11A is a circuit diagram of a column decoder, in accordance with an embodiment of the present disclosure.

FIG. 11B is a circuit diagram of a column decoder circuit in FIG. 11A, in accordance with an embodiment of the present disclosure.

DETAILED DESCRIPTION OF PREFERRED EMBODIMENTS

Various embodiments of the present disclosure will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
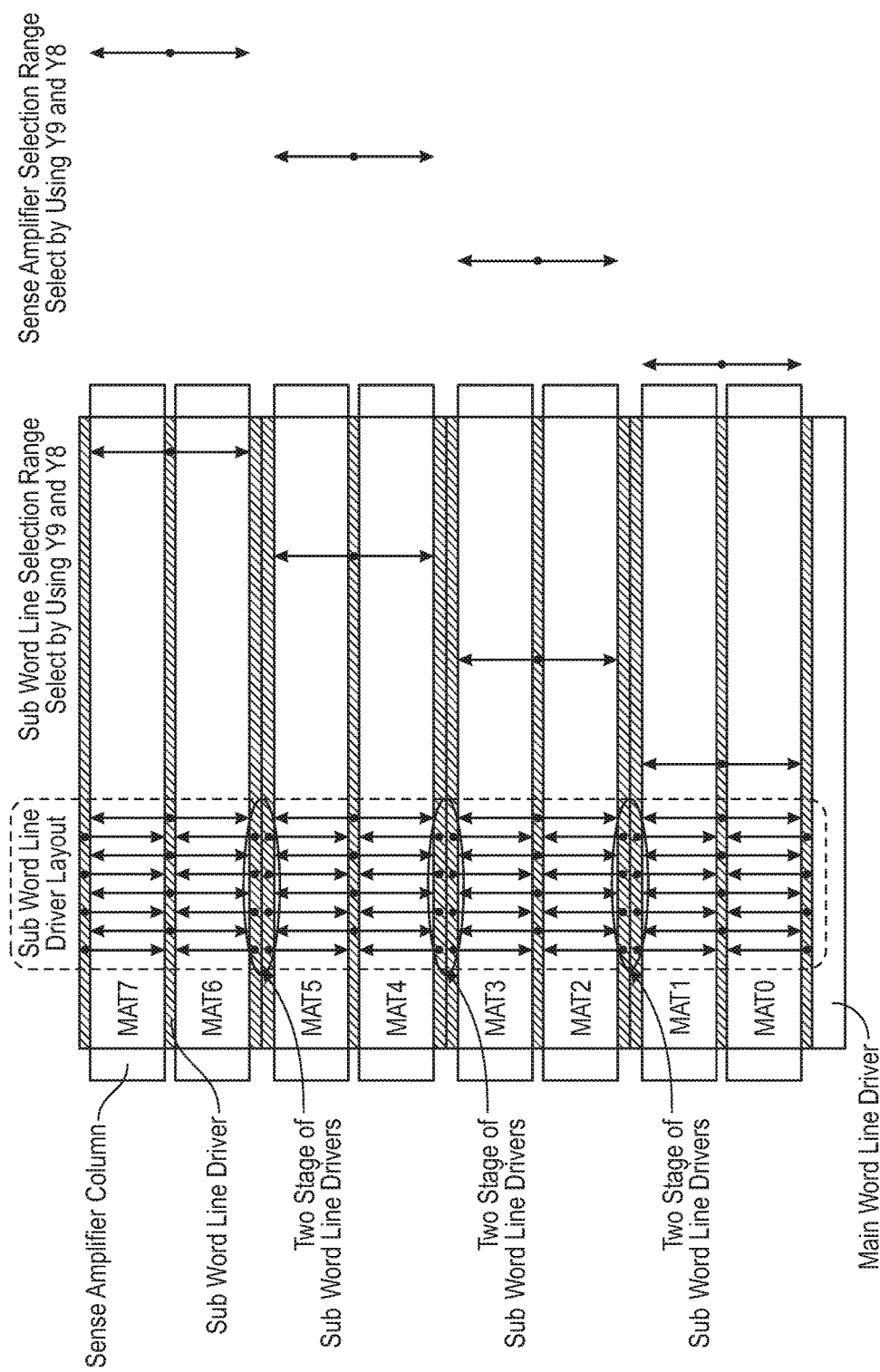
FIG. 1 is a schematic diagram of column segments in dynamic random-access memory (DRAM).
Figure 2:
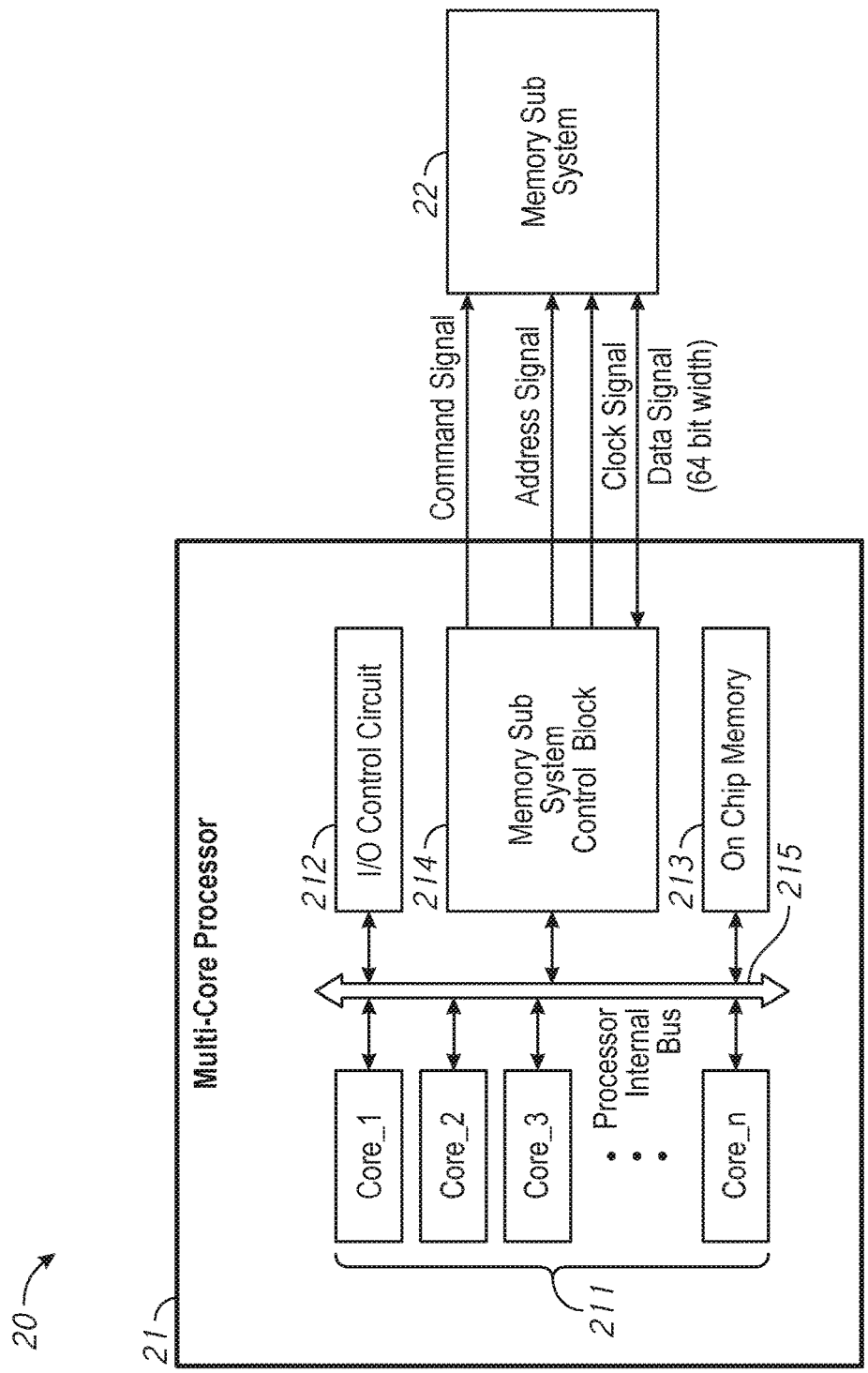
FIG. 2 is a block diagram of a computer system including a memory sub system, in accordance with an embodiment of the present disclosure.

FIG. 2 is a block diagram of a computer system including a memory sub system, in accordance with an embodiment of the present disclosure. The computer system 20 includes a multi-core processor 21 and a memory sub system 22. The multi-core processor 21 includes a plurality of cores 211 (Core_1, Core_2, Core_3 . . . Core_n) where n is a natural number that is the number of the plurality of cores 211. The plurality of cores 211 are processing circuits which read and execute program instructions independently. The computer system 20 also includes an input/output (I/O) control circuit 212, which handles communication signals between the multi-core processor 21 and other circuits in the computer system 20. The multi-core processor 21 also includes an on-chip memory 213 and a memory sub system control block 214. Communications between the plurality of cores 211, the I/O control circuit 212, the on-chip memory 213 and the memory sub system control block 214 are provided via a processor internal bus 215. The memory sub system control block 214 on the multi-core processor 21 handles communication with the memory sub system 22 that may be outside of the multi-core processor 21. For example, the memory sub system control block 214 may provide access requests to the memory sub system 22 from the plurality of cores 211. The memory sub system control block 214 provides a clock signal, a command signal and an address signal to the memory sub system 22. While writing data by storing the data in the memory sub system 22, the memory sub system control block 214 provides write data to the memory sub system 22 with a write command. While reading the stored data from the memory sub system 22, the memory sub system control block 214 provides a read command and receives the data from the memory sub system 22.

In one embodiment, the memory sub system 22 may have a configuration of a memory module including a plurality of memory chips mounted in parallel with one another that operate simultaneously. For example, eight memory chips may be included and each memory chip may include a data bus having an eight bit width, thus the memory sub system 22 may have a sixty-four bit width. The plurality of memory chips may be arranged and disposed on the module as one layer, or may be disposed as stacked layers. In one embodiment, the memory sub system 22 may include a plurality of memory modules. In one embodiment, the memory chip may be any memory having functionality of a main memory. For example, the memory chip may be dynamic random-access memory (DRAM) or nonvolatile random-access memory (RAM), such as ferroelectric RAM (FeRAM), spin-transfer-torque RAM (SIT-RAM), phase-change RAM (PCRAM), resistance change RAM (ReRAM), or the like.

Figure 3:
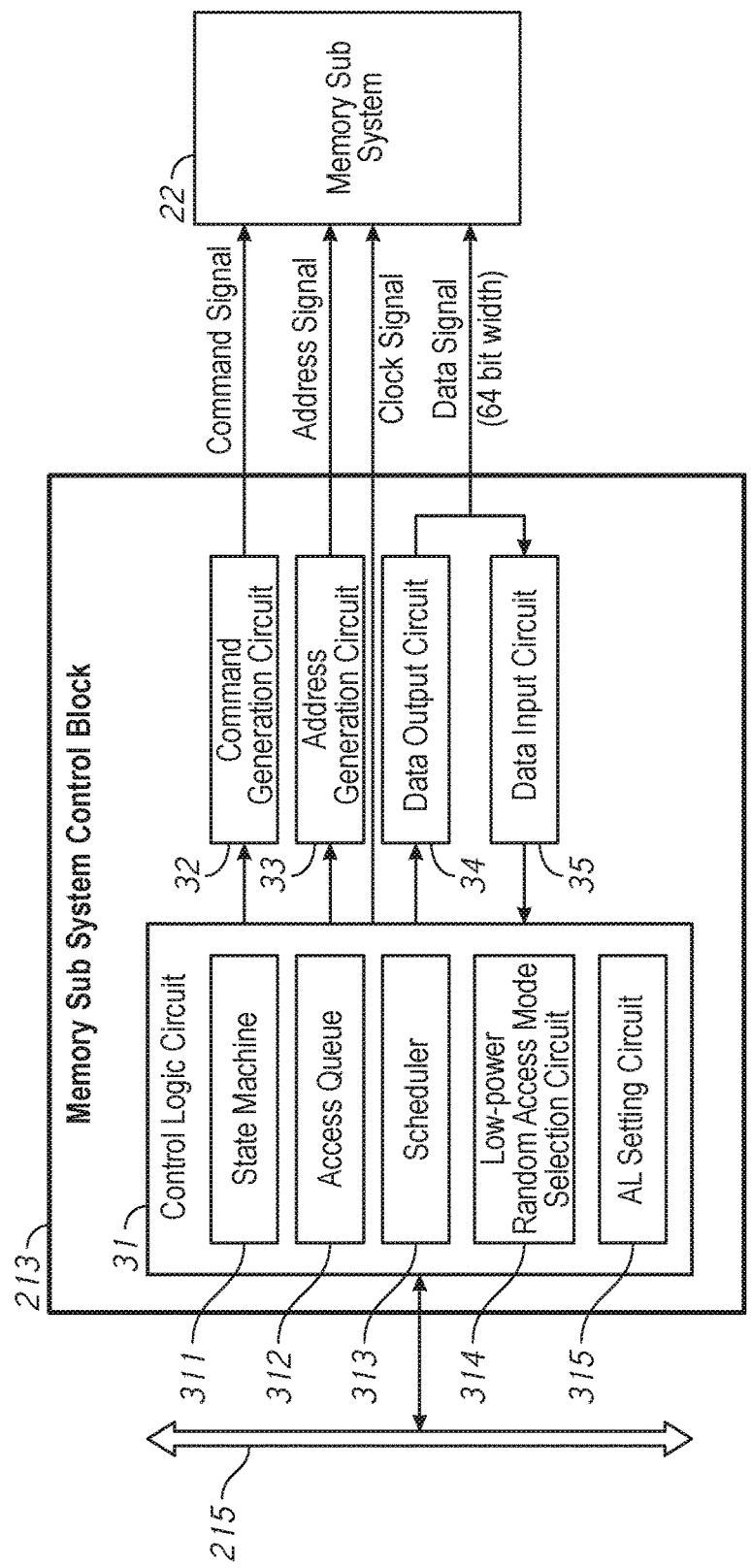
FIG. 3 is a block diagram of a portion of the computer system of FIG. 2, in accordance with an embodiment of the present disclosure.

FIG. 3 is a block diagram of a portion of the computer system 20 of FIG. 2, in accordance with an embodiment of the present disclosure. In particular, the block diagram of FIG. 3 illustrates architecture of a memory sub system control block 213, which may be used as a memory sub system control block 213 of FIG. 2. For example, the memory sub system control block 213 may include a control logic circuit 31, a command generation circuit 32, an address generation circuit 33, a data output circuit 34 and a data input circuit 35. The command generation circuit 32 may provide a command signal to the memory sub system 22. The address generation circuit 33 may provide an address signal to the memory sub system 22. The data output circuit 34 may provide data to be written to the memory sub system 22, and the data input circuit 35 receives data read from the memory sub system 22. The control logic circuit 31 controls the command generation circuit 32, the address generation circuit 33, the data output circuit 34 and the data input circuit 35, independently. The control logic circuit 31 includes a state machine 311 for controlling the memory sub system 22, an access queue 312 for storing access requests, a scheduler 313 for controlling an order of data access and a low-power random access mode selection circuit 314. The control logic circuit 31 controls access requests to the memory sub system from the plurality of cores 211 in FIG. 2 as described earlier. An additive latency (AL) setting circuit 315 may set an additive latency, as will be described later in detail. The memory sub system 22 reduces power consumption in executing read/write commands with auto-precharge enabled by setting the additive latency (AL) using a posted-command address strobe (CAS) mode.

Figure 4:
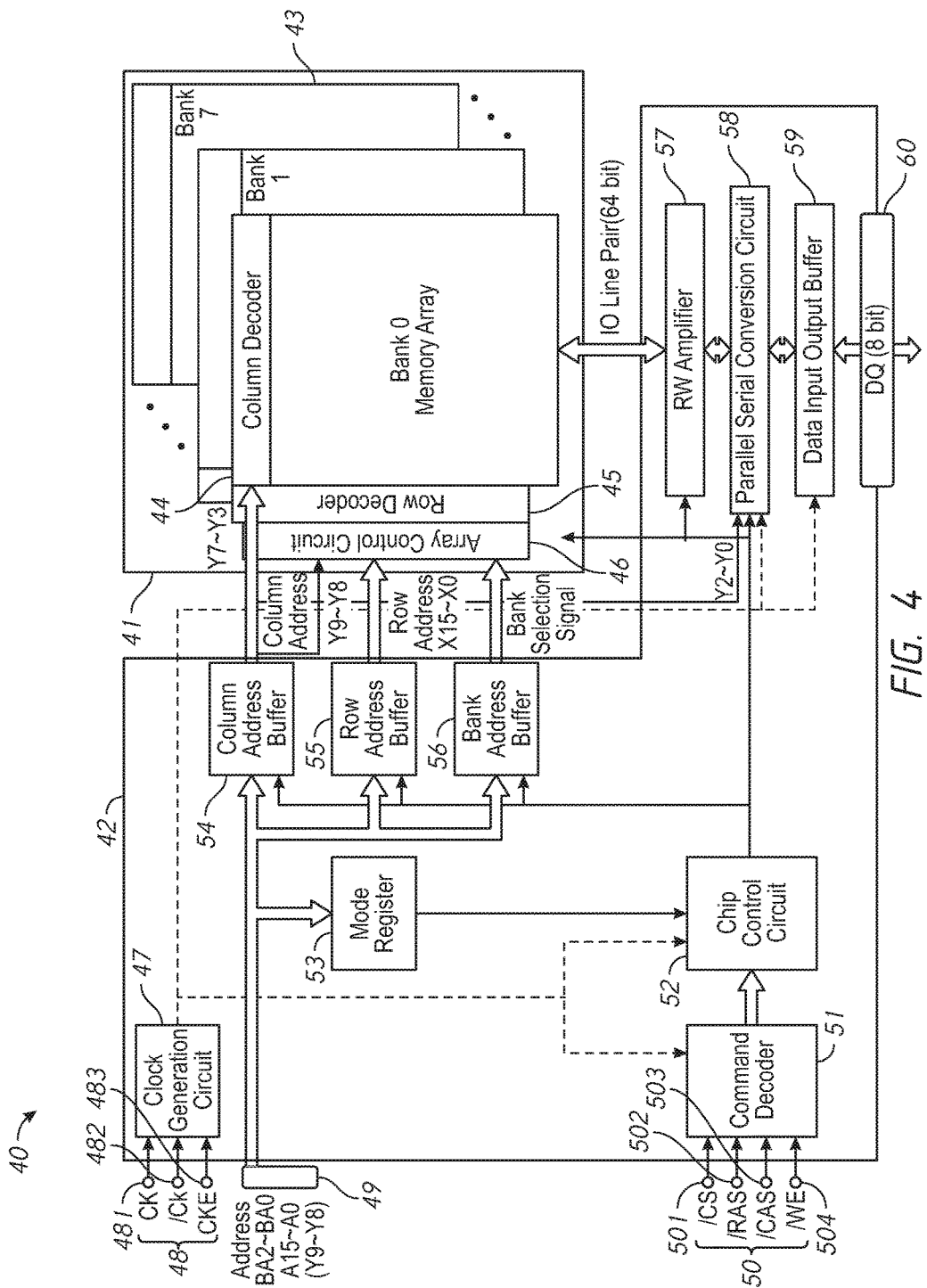
FIG. 4 is a block diagram of a memory chip in the memory sub system, in accordance with an embodiment of the present disclosure.

FIG. 4 is a block diagram of a memory chip in the memory sub system, in accordance with an embodiment of the present disclosure. The memory chip 40 may be DRAM or non-volatile RAM integrated into a single semiconductor chip, for example, however, other devices may also be the memory chip 40 of the present disclosure. The memory chip 40 may be mounted on a memory module substrate, a mother board or the like (not shown). The memory chip includes a memory cell array region 41 and a peripheral circuit region 42. The memory cell array region 41 includes a memory cell array 43 including a plurality of banks, each bank including a plurality of word lines, a plurality of bit lines, and a plurality of memory cells arranged at intersections of the plurality of word lines and the plurality of bit lines. For example, a number of the plurality of banks may be eight as shown in FIG. 4. The selection of the bit line is performed by a plurality of column decoders 44 and the selection of the word line is performed by a plurality of row decoders 45. An array control circuit 46 is provided for selecting a bank of the memory cell array 43.

The peripheral circuit region 42 includes clock terminals 48, address terminals 49, command terminals 50, and data input/output (I/O) terminals (DQ) 60. For example, the data I/O terminals may handle eight-bit data communication. Data Input Output (I/O) buffers 59 are coupled to the data input/output terminals (DQ) 60 for data accesses, such as read accesses and write accesses of memories. The data accesses between the data I/O buffer 59 and the memory cell array 43 may be executed by a read/write (RW) amplifier 57 and a parallel serial conversion circuit 58 that converts between parallel data in the memory cell array region 41 and the data I/O terminal 60. Thus, the data is transferred between the RW amplifier 57 and the data I/O buffer 59.

The address terminals 49 are supplied with address signals A15-A0 and bank address signals BA0-BA2. The bank address signals may be used for selecting a bank among the plurality of banks. The bank address signals are provided to an array control circuit 46 for selecting a bank via a bank address buffer 56 as a bank selection signal. For example, there are three bank address signals BA0-BA2 which allows to select one bank among eight banks as shown in FIG. 4. In one embodiment, a row address and a column address may be provided on the address signals A15-A0 by address multiplexing. In a memory chip without additive latency and posted CAS-mode, a portion of the column address, (e.g., Y9 and Y8 in FIG. 4) may not be multiplexed, and may be supplied separately simultaneously with the row address.

The command terminals 50 may include a chip select (/CS) pin 501 for receiving a complementary CS signal, a row address strobe (/RAS) pin 502 for receiving a RAS signal, a column address strobe (/CAS) pin 503 for receiving a CAS signal, a wrote enable (/WE) pin 504 for receiving a WE signal and the like. A command decoder 51 decodes command signals from the command terminals 50 to receive various commands including a read command and a write command, and provides control signals responsive to the received commands to a chip control circuit 52.

Accordingly, read data is read from a memory cell in the memory cell array 43 designated by a row address and a column address, when the read command is issued and the row address and the column address are timely supplied with the read command. The read data DQ is output from the data I/O terminals 60 via the RW amplifier 57, the parallel serial conversion circuit 58 and the data I/O buffer 59. Similarly, write data. DQ is supplied to the data I/O terminals 60 via the data I/O buffer 59, the parallel serial conversion circuit 58, and the RW amplifier 57 to the memory cell array 43 and is written to the memory cell designated by a row address and a column address when the write command is issued and the row address and the column address are timely supplied with the write command.

The clock terminals 48 include clock pins CK 481/CK 482 and a clock enable (CKE) pin 483. The clock terminals 48 are supplied with external clock signals CK and /CK at the CK pin 481 and /CK pin 482, respectively. A clock enable (CKE) signal is supplied at the CKE pin 483 of the clock terminals 48, The CKE signal may activate or deactivate internal clock circuits, input buffers and output drivers, thus the CKE signal is part of a command. The external clock signals CK and/CK are complementary to each other and are supplied to a clock generator 47. The clock generator 47 receives the external clock signals CK and/CK and may execute phase control and generates an internal clock signal based on the received external clock signals and the CKE Although not limited thereto, a DLL circuit can be used as the clock generator 47. The internal clock signal may be supplied various circuits, including the command decoder 51, the chip control circuit 52, the data I/O buffer 59, or the like. The various circuits may use the internal clock signal as a timing signal.

Figure 5:
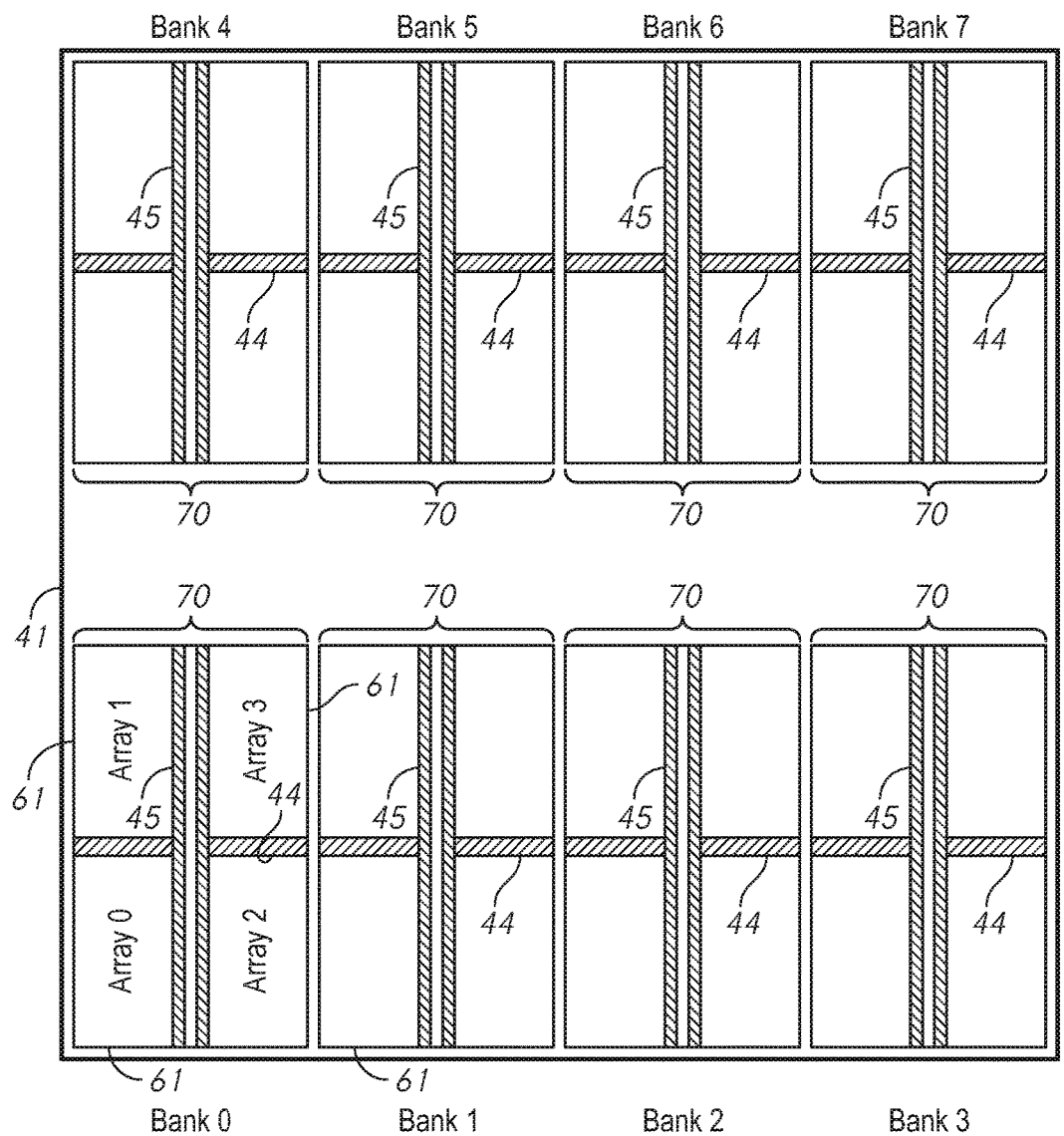
FIG. 5 is a layout diagram of the memory chip of FIG. 4, in accordance with an embodiment of the present disclosure.

FIG. 5 is a layout diagram of a memory cell array region of the memory chip of FIG. 4, in accordance with an embodiment of the present disclosure. The memory cell array region 41 includes banks 70 and arrays 61 in the banks 70. For example, a number of the banks in the memory cell array region 41 may be eight and each bank may be selected by the bank addresses BA2 to BA0. For example, a column decoder 44 and row decoders 45 may be provided for each bank. Two row decoders 45 may be disposed in the center portion in one direction of each bank, and the column decoder 44 may he disposed in the center portion in a direction substantially perpendicular to the one direction. Each bank 70 may include four arrays 61, such as Array 0 to Array 3, which are disposed on four regions of each bank divided by the row decoders 45 and the column decoder 44.

Figure 6:
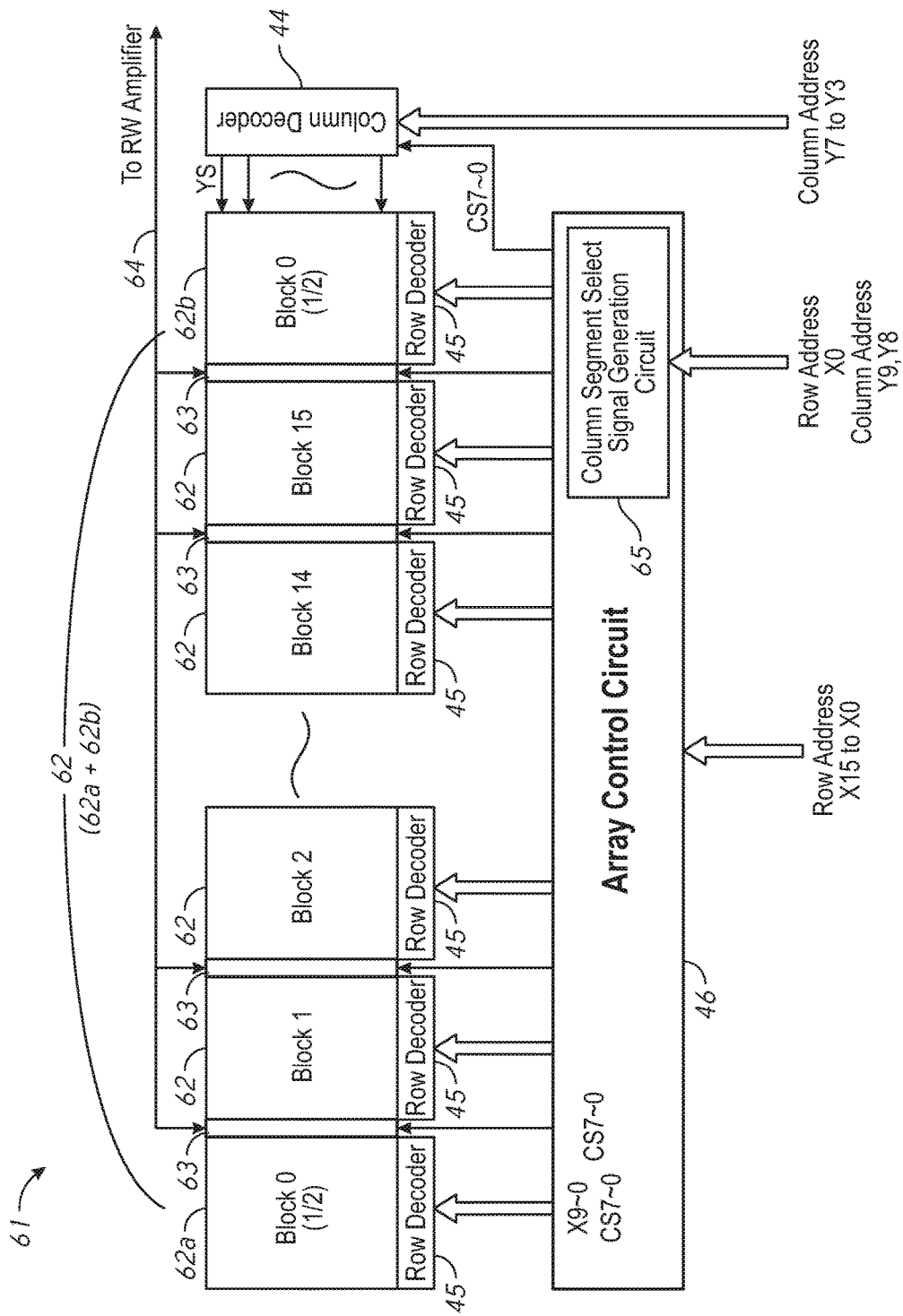
FIG. 6 is a block diagram of a memory array in the memory chip of FIG. 5 in accordance with an embodiment of the present disclosure.

FIG. 6 is a block diagram of a memory array in the memory chip of FIG. 5, in accordance with an embodiment of the present disclosure. For example, each array 61 may be divided into sixteen blocks 62. Here, Block 0 62 may be divided into two sub blocks 62a and 62b. The sub block 62a is a half portion of Block 0 62 disposed at one end. The sub block 62b is the other half portion of Block 0 62 disposed at the other end. Because Block 0 62 is divided into two sub blocks 62a and 62b disposed at the two ends, a total of seventeen blocks including fifteen full blocks 62 and two sub blocks 62a and 62b are disposed in the array 61. Each bank 70 includes four arrays 61 (as shown in FIG. 5), and each array 61 includes the above blocks 62 equivalent to full sixteen blocks, a total of sixty-four blocks 62 from Block 0 to Block 63 may be disposed on each bank 70. For example, Block 0 to Block 15 may be included in Array 0. Each block 62 may be selected by a block address that is indicated by a portion of the row address (e.g., six bits, such as X15 to X10). For example, Block 0 is selected when the block address indicated by the six bits X15 to X10 is "000000". For example, a word line is selected by a portion of the row address e.g., ten bits, such as X9 to X0), and a number of word lines in each block may be 1024.

An array control circuit 46 receives row address signals X15 to X0 and provides the portion of the row address signals (e.g., X9 to X0) representing the word line selection to a block selected by the block address (e.g., X15 to X10). The array control circuit 46 may include a column segment selection signal generation circuit 65. The column segment selection signal generation circuit 65 may receive a portion of the row address signals (e.g., a least significant bit X0) and a portion of the column addresses signals (e.g., two bits Y9 and Y8). Responsive to the portion of the row address signals and the portion of the column addresses signals, the column segment selection signal generation circuit 65 may provide column segment signals (e.g., CS7 to CS0). The array control circuit 46 provides the portion of row address signals (e.g., X9 to X0) and the column segment signals (e.g., CS7 to CS0). Each block includes a row decoder 45 that receives the portion of row address signals (e.g., X9 to X0) and the column segment signals (e.g., CS7 to CS0) and selects a main word line (MINT) responsive to the portion of row address signals (e.g., X9 to X0) and the column segment signals (e.g., CS7 to CS0). Each block 62 may also include a sub word driver (will be described later) for selecting a sub word line SWL. Each block 62 may further include sense amplifiers 63. Each sense amplifier 63 amplifies a signal read out from a memory cell selected by the sub word line onto a bit line. The column segment signals (CS7 to CS0) may be provided to sense amplifiers 63 from the array control circuit 46 and one or more sense amplifiers 63 may be activated responsive to the column segment signals.

Column address signals (e.g., Y7 to Y3) and the column segment signals (CS7 to CS0) may be provided to the column decoder 44. One logical line is selected among 128 column selection lines (YS) by activating eight physical lines among 1024 YS physical lines. Responsive to the selection of the eight physical lines, sixty-four sense amplifiers 63 and sixty-four pairs of IO lines 64 within a page selected by an active command (ACT) are selectively coupled to each other. The read data and write data of memory cells of sixty-four bits selected are exchanged between the memory cell array and a R/W amplifier 57 in FIG. 4 through the pairs of IO lines 64. As shown in FIG. 4, a parallel/serial conversion circuit 58 is disposed between the R/W amplifier 57 and a data I/O buffer 59, and parallel data of sixty-four bits and serial data having an eight burst length with an eight bit width are converted to each other in accordance with a portion of the column address signals (e.g., Y2 to Y0). For example, each block 62 includes memory cells having a total of about 8M bits of 1024 rows by 128 columns by sixty-four bits. In this example, each bank includes approximately 512 M bits of sixty-four blocks. One chip includes a total of approximately 4 G bits including eight banks.

Figure 7:
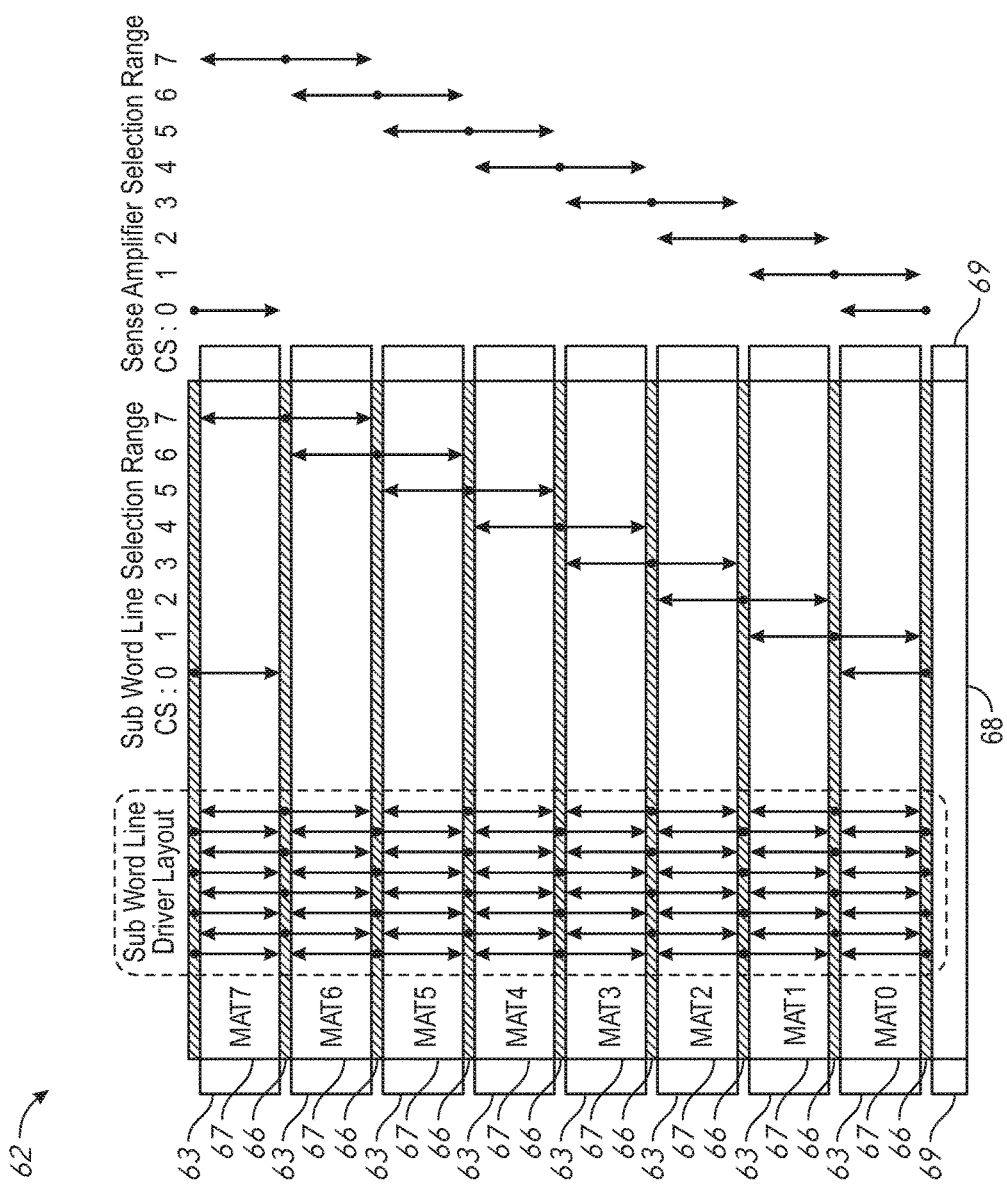
FIG. 7 is a schematic diagram of column segments in dynamic random-access memory (DRAM), in accordance with an embodiment of the present disclosure.

FIG. 7 is a schematic diagram of column segments in dynamic random-access memory (DRAM), in accordance with an embodiment of the present disclosure. Each block 62 may be divided into a plurality of memory cell matrices 67 (e.g., MAT0 to MAT7). Each block may include a main word line (MWL) driver 68 to activate a main word line. Sub word line (SWL) drivers 66 are disposed between the memory cell matrices 67 and on the upper and lower sides of the block 62 and coupled to the main word line. Each SWL driver 66 corresponds to one column segment including two memory cell matrices 67 adjacent to each SWL driver 66. A sub word line selection signal decoder 69 may be disposed at sides of the MWL driver 68 and provides sub word selection signals. The column segment signals CS7 to CS0 may be generated in the column segment selection signal generation circuit 65 in FIG. 6 from the portion of the row address signals (e.g., X0) and a portion of the column address signals (e.g., Y9 and Y8). Each sub word line for two mats can be selected by each column segment signal. For example, MAT0 and MAT7 may be selected by selecting CS0. Similarly, MAT0 and MAT1 may be selected by selecting CS1. A corresponding sense amplifier 63 may be activated simultaneously, responsive to each column segment signal. By selecting one column segment signal (CS: e.g., 0, 1, 2, 3, 4, 5, 6, 7), a sub word line selection range of one or more matrices and a sense amplifier selection range of one or more matrices may be defined as shown in FIG. 7. Thus, selection of a column segment including selection of a sub word line and activation of a corresponding sense amplifier can be executed by selection of one column segment signal.

Figures 8A, 8B:
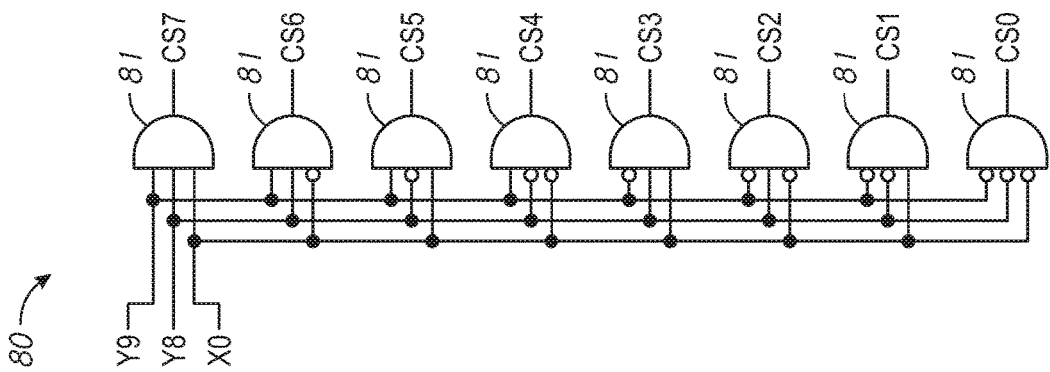
FIG. 8A is a circuit diagram of a column segment selection signal decoder in the column segment selection signal generator circuit of FIG. 6, in accordance with an embodiment of the present disclosure.
FIG. 8B is a truth table of the column segment selection signal decoder of FIG. 8A, in accordance with an embodiment of the present disclosure.

FIG. 8A is a logic diagram of a column segment selection signal decoder in the column segment selection signal generation circuit 65 of FIG. 6, in accordance with an embodiment of the present disclosure. FIG. 8B is a truth table of the column segment selection signal decoder of FIG. 8A, in accordance with an embodiment of the present disclosure. For example, a column segment selection signal decoder 80 of FIG. 8A may include logic circuits 81, where each logic circuit 81 may correspond to a relationship between the column segment signal and a combination of the row address signal X0 and the column address signal Y9 and Y8. For example, each logic circuit 81 may be an AND gate that receive the combination of the row address signal X0 and the column address signal Y9 and Y8. Depending on the relationship, some of the combination of the row address signal X0 and the column address signal Y9 and. Y8 may be inverted at input nodes of each logic circuit 81. Thus, the column segment selection signal decoder 80 may decode the row address signal X0 and the column address signal Y9 and Y8 and further generate the column segment signals CS7 to CS0 based on a block to be activated by a current command, responsive to the row address signal X0 and the column address signals Y9 and Y8. In other word, the column segment selection signal decoder 80 activates at least one of the plurality of column segment signals CS7 to CS0, responsive to a portion of column address signals, such as the column address signals Y9 and Y8, and a portion of the row address signals, such as the row address signal X0.

Figures 9A, 9B:
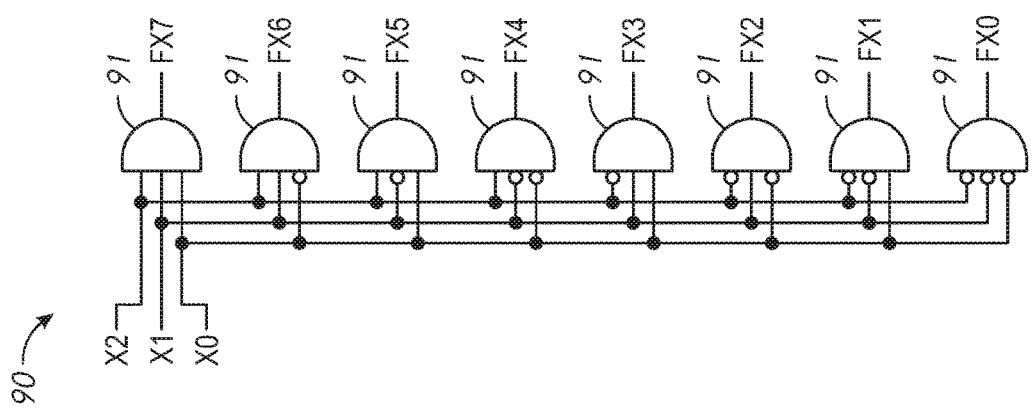
FIG. 9A is a logic diagram of a sub word line selection signal decoder, in accordance with an embodiment of the present disclosure.
FIG. 9B is a truth table of the sub word line selection signal decoder of FIG. 9A, in accordance with an embodiment of the present disclosure.

FIG. 9A is a logic diagram of a sub word-line selection signal decoder, in accordance with an embodiment of the present disclosure. FIG. 9B is a truth table of the sub word line selection signal decoder of FIG. 9A, in accordance with an embodiment of the present disclosure. For example, the sub word line selection signal decoder 90 may be used as the sub word line selection signal decoder 69 in FIG. 7. The sub word line selection signal decoder 90 of FIG. 9A may include logic circuits 91, where each logic circuit 91 may correspond to a relationship between the sub word line selection range and a combination of the row addresses signal X2 to X0. For example, each logic circuit 91 may be an AND gate and may receive the combination of the row address signals X2 to X0. Depending on the relationship, some of the combination of the row address signals X2 to X0 may be inverted at input nodes of each logic circuit 91. Thus, the sub word line selection signal decoder 90 may decode the row address signals X2 to X0 and further generate sub word selection signals FX7 to FX0 responsive to the row address signals X2 to X0. In other word, the sub word line selection signal decoder 90 activates at least one of a plurality of sub word selection signals FX7 to FX0 responsive to the row address signals corresponding to lower bits of the row address, including a least significant bit X0. The sub word line selection signal decoder 90 may selectively activate one of the sub word line selection signals FX7 to FX0 by way of signal lines for the column segment signals CS7 to CS0.

Figure 10:
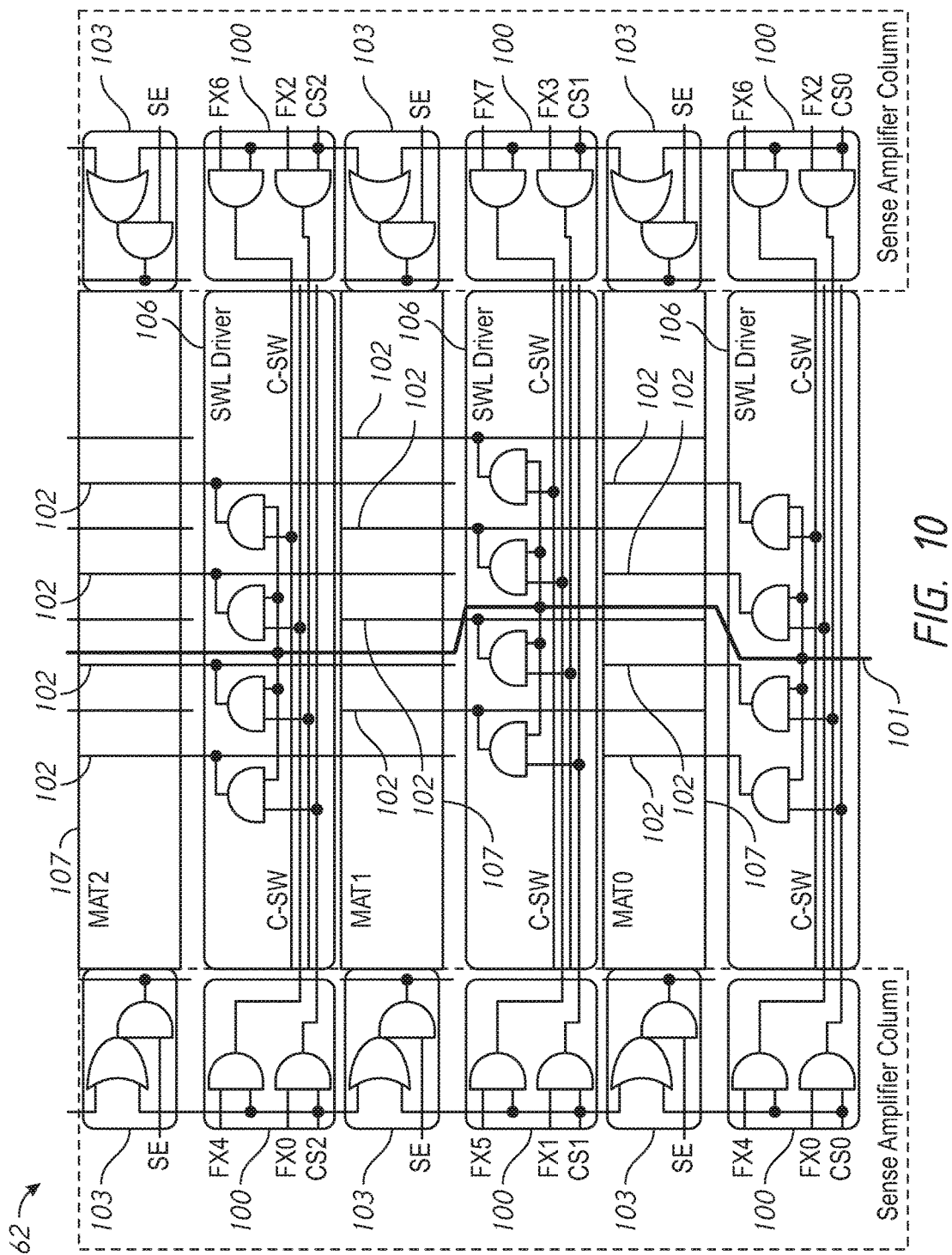
FIG. 10 is a circuit diagram of column segments in dynamic random-access memory (DRAM), in accordance with an embodiment of the present disclosure.

FIG. 10 is a circuit diagram of column segments in dynamic random-access memory (DRAM), in accordance with an embodiment of the present disclosure. Each block 62 includes a plurality of column segment selection circuits 100. Each of the column segment selection circuits 100 may activate at least one of column-subword (C-SW) selection signals responsive to the activated sub word selection signal of the sub word selection signals FX7 to FX0 and the activated column segment signal of the column segment signals CS7 to CS0, as earlier described referring to FIGS. 8A and 9A. Responsive to the column segment signals CS7 to CS0 with a sense amplifier activation signal SE, one of a plurality of sense amplifiers selection circuits 103 may be selected to activate corresponding sense amplifiers 63 in FIG. 7. The column segments includes matrices 107 (e.g., MAT0 to MAT2), sub word line (SWL) drivers 106 between the matrices 107 and sense amplifier columns including sense amplifiers selection circuits 103 corresponding to the matrices 107 at sides of the matrices 107. Each sub word line SWL 102 associated with each matrix 107 is driven by each SWL driver 106 disposed on sides of each sub word line SWL 102, responsive to an active main word line MWL 101 and the active C-SW selection signal. For example, SWL drivers 106 are disposed on an upper side and a lower side of a sub word line SWL 102. When a column segment signal CS1 for selecting a column segment including matrices MAT0 and MAT1 is set to an active level (e.g., a logic high level), one of the main word lines MWL 101 is set to the active level as a result of decoding the row address signals X9 to X3. When any one of the sub word line selection signals FX1, FX3, FX5 and FX7 is set to the active level by decoding the row address signals X2 to X0, the SWL drivers 106 may activate a corresponding sub word line SWL 102 coupled to the matrices MAT0 and MAT1 107 to the active level. In other word, the SWL driver 106 may drive the corresponding sub word line responsive to the activated sub word line selection signal and the activated MWL 101. The sense amplifier activation signal SE is provided to the sense amplifiers selection circuits 103 for the matrices MAT0 and MAT1 107, when the column segment signal CS1 for the matrices MAT0 and MAT1 107 is set to the active level. In this manner, a combination of a sub word line SWL 102 and a sense amplifier selection circuits 103 corresponding to a matrix 107 selected by one of the column segment selection signals CS7 to CS0 may be activated.

FIG. 11A is a circuit diagram of a column decoder, in accordance with an embodiment of the present disclosure. The column decoder 44 controls selecting one of column selection lines YS. For example, the column decoder 44 may include column decoder circuits 112 and logic gates 113 that are OR circuits that receives two of the column segment signals CS0 to CS7. For example, the column decoder circuits 112 and the logic gates 113 in FIG. 11A may correspond to the matrices MAT0 to MAT2 in FIG. 10. For example, two column decoder circuits 112 may be selected responsive to the active level of the column segment signal CS1 for the matrices MAT0 and MAT1. FIG. 11B is a circuit diagram of a column decoder circuit in FIG. 11A, in accordance with an embodiment of the present disclosure. Each column decoder circuit 112 may include logic gates such as 1000-1031, 1100-1131, 1200-1231 and 1300-1331 that are NAND circuits. When one of thirty-two logical column selection lines YS31 to YS0 is selected, four lines among 128 physical column selection lines corresponding to the selected logical column selection line may be activated responsive to the column address signals Y7 to Y3. In other word, the column decoder circuit 112 may produce a plurality of column selection signals corresponding to the physical column selection lines responsive to a portion of the column address signals (e.g., Y7 to Y3), further responsive to the plurality of the column segment signals (e.g., CS2 and CS1 for the column decoder circuit 112 in the middle of FIG. 11A). For example, the physical column selection lines 0-0, 0-1, 0-2 and 0-3 are set to the active level when the logical column selection line YS0 is selected. As earlier mentioned, two column decoders corresponding to one column segment such as two matrices (e.g., MAT0 and MAT1) may be selected. Thus, a total of eight physical column selection lines YS may be activated.

Figure 12A:
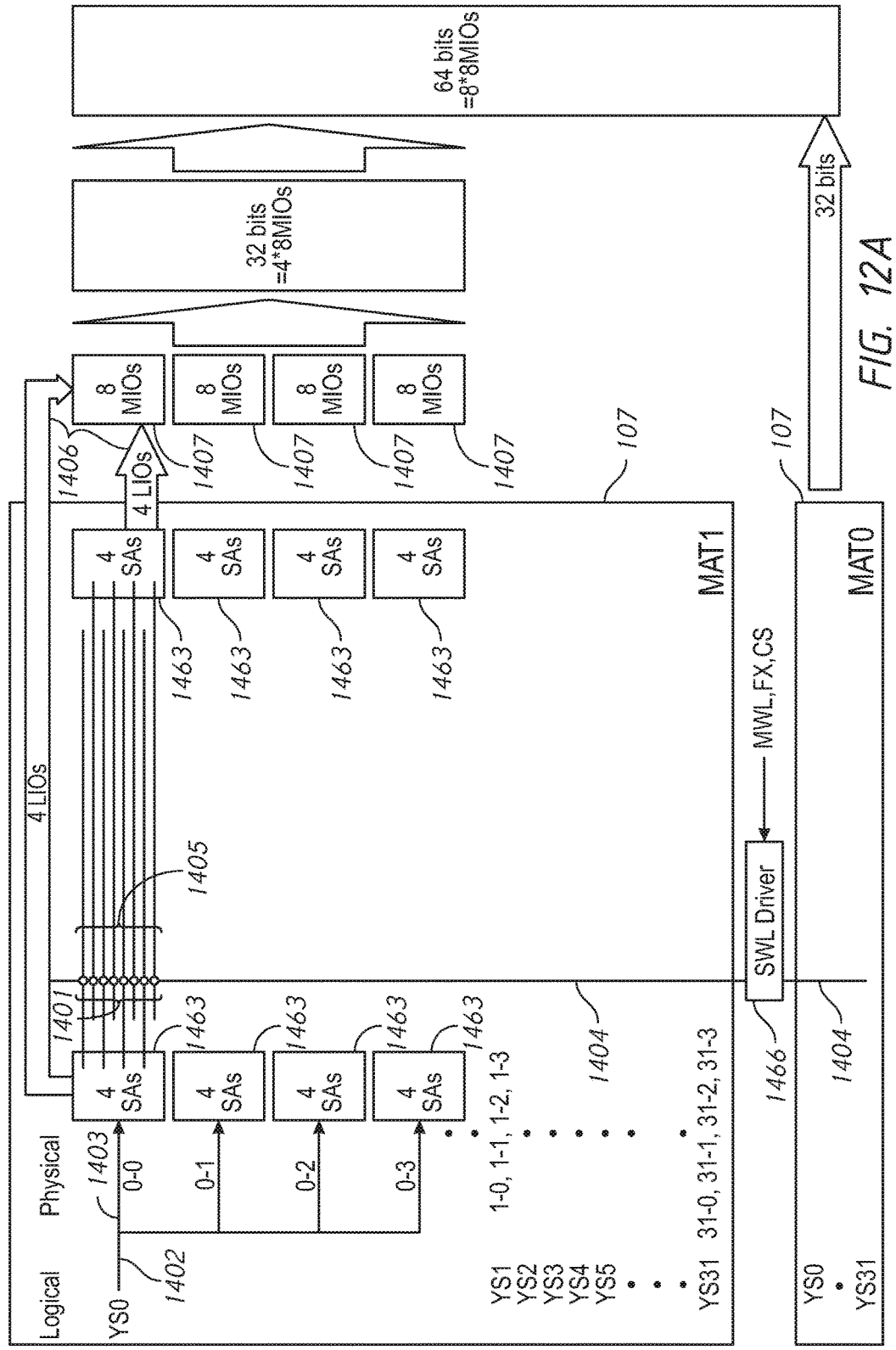
FIG. 12A is a block diagram of an input/output line selection scheme in a block in accordance with an embodiment of the present disclosure.

FIG. 12A is a block diagram of an input/output line selection scheme in a block in accordance with an embodiment of the present disclosure. For example, a matrix MAT1 107 may include memory cells 1401. The matrix MAT1 107 also includes sub word lines (SWLs) 1404 and bit lines (BLs) 1405 for accessing each memory cell 1401. As described earlier, a sub word line (SWL) driver 1466 may be disposed between two matrices, such as MAT1 and MAT0. The SWL driver 106 in FIG. 10 may be used as the SWL driver 1466. The SWL driver 1466 may receive a signal from a main word line (MWL) driver MWL, such as the MWL driver 68 in FIG. 7, as well as sub word line selection signals FX and column segment signals CS as described with FIG. 10. Responsive to the MWL, FX and CS signals, the SWL driver 1266 may activate the sub word line SWL 1404 for MAT1 and MAT0. The matrix MAT1 107 may include 1024 bit lines, for example. One block including eight matrices includes 8192 (=1024×8) bit lines. As described earlier, the matrix MAT1 107 may be coupled to thirty-two logic column selection lines YS31 to YS0 1402. When one of thirty-two logical column selection lines 1402 (e.g., YS31 to YS0) is selected, four physical column selection lines 1403 corresponding to the selected logical column selection line 1402 may be activated. For example, the physical column selection lines 1403 (e.g., 0-0, 0-1, 0-2 and 0-3 in FIG. 12A) are set to the active level when the logical column selection line 1402 (e.g., YS0) is selected. As earlier mentioned, one column segment including two matrices 107 (e.g., MAT0 and MAT1) may be selected by activating the sub word line SWL 1404 for the two matrices 107. In FIG. 12A, four sense amplifiers 1463 on a left side in FIG. 12A and four sense amplifiers 1463 on a right side in FIG. 12A may be coupled to corresponding four local input/output lines (LIOs) 1406 responsive to one physical column selection line 1403. For example, data in the memory cells 1401 may be through four upper LIOs 1406 coupled to the four sense amplifiers 1463 on the left side and four lower LIOs 1406 coupled to the four sense amplifiers 1463 on the right side in the matrices 107. The total of eight LIOs 1406 in the matrix 107 (e.g., MAT1) are coupled to eight main input/output lines (MIOs) 1407. The eight MIOs correspond to one physical column selection line 1403, and four physical column selection lines 1403 are activated by the activation of one logical column selection line 1402. That is, a total thirty-two bits of memory cells 1401 from one matrix 107 may be accessed simultaneously, Because one active sub word line 1404 corresponds to two matrices 107 in one block which may be activated in a bank, a total of sixty-four bits may be accessed by a combination of eight physical column selection lines 1403 (e.g., 0-0, 0-1) based on one logical column selection line YS 1402 and a selection of the sub word line SWL 1404.

Figure 12B:
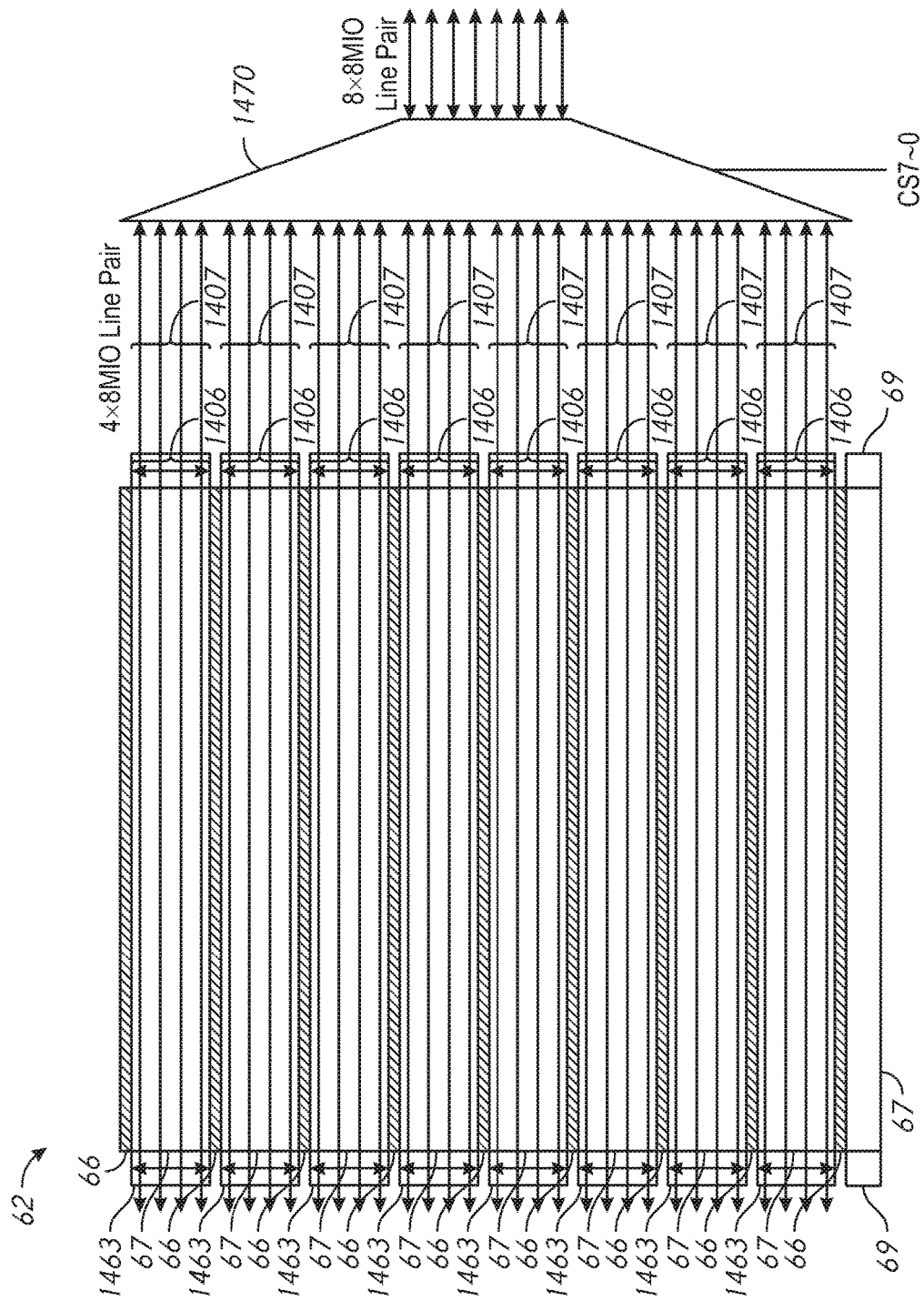
FIG. 12B is a schematic diagram of a layout of input/output lines and a selection circuit in a block in accordance with an embodiment of the present disclosure.

FIG. 12B is a schematic diagram of a layout of input/output lines and a selection circuit in a block in accordance with an embodiment of the present disclosure. Each block 62 is coupled to a plurality of pairs of LIOs 1406. The plurality of pairs of IO lines are hierarchically divided to pairs of LIOs 1406 and pairs of MIOs 1407. Connection of the pairs of LIOs 1406 and the pairs of MIOs 1407 are controlled by a plurality of sense amplifiers 1463 for each matrix. Responsive to activation of one physical column selection line 1403 as shown in FIG. 12A, four sense amplifiers 1463 in each side of a matrix 67 are coupled to four pairs of LIOs 1406. The four pairs of LIOs 1406 are coupled to four pairs of MIOs 1407. Thus, a total of eight pairs of MIO lines 1407 on both sides of the matrix 67 are activated responsive to the activation of physical column selection line YS 1403. Within one matrix 67, four physical column selection line 1403 may be activated responsive to activation of one logical column selection line YS 1402, as shown in FIG. 12A. Thus, a total of thirty-two sense amplifiers 1463 may be coupled to thirty-two pairs of MIOs 1407 within one matrix 67. As a result, a total of sixty-four sense amplifiers 1463 may be coupled to sixty-four pairs of MIOs 1407 in a column segment including two matrices 67. An I/O selection circuit 1470 selectively couples the sixty-four pairs of MIOs 1407 to an RW amplifier, such as the RW amplifier 57 in FIG. 4, responsive to the column segment signals CS7 to CS0. Thus, the I/O selection circuit handles data communication between the sixty-four pairs of MIOs 1407 and the RW amplifier. For example, the I/O selection circuit may have a circuitry structure similar to the column decoder 44 in FIG. 11A, therefore the description thereof will be omitted.

Figure 13:
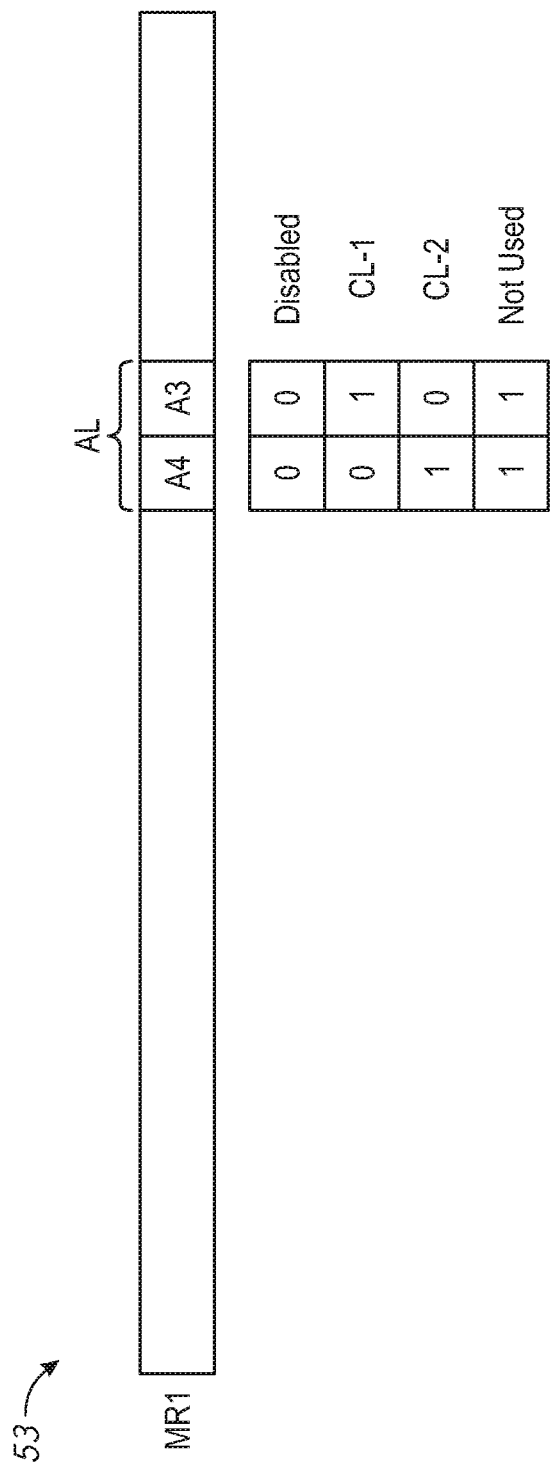
FIG. 13 is a schematic diagram of a mode register, in accordance with an embodiment of the present disclosure.

In one embodiment, column segment selection may be executed responsive to a bank active command and an auto-precharge command issued consecutively while additive latency is activated. The column segment selection above may be compliant with JEDEC standard, FIG. 13 is a schematic diagram of a mode register MR1 53, in accordance with an embodiment of the present disclosure. A double data rate type three synchronous DRAM (DDR3 SDRAM) or a double data rate fourth generation SDRAM (DDR4 SDRAM) in compliance with JEDEC may include a mode register MR1 53 which may be used as the mode register 53 in FIG. 4. The mode register 53 may include AL bit fields A4 and A3 which represent a status of activation of the additive latency. The activation of the additive latency AL and an amount of the additive latency AL may be set in the AL bit fields A4 and A3 of the mode register 53. For example, the additive latency may be disabled when the AL bit fields A4 and A3 of the mode register 53 are set to "0" and "0". For example, the amount of the additive latency AL is set to be "CL-1" where CL is a CAS latency, when the AL bit fields of A4 and A3 are set as "0" and "1". The amount of the additive latency AL is set to be "CL-2", when the AL bit fields of A4 and A3 are set as "1" and "0".

Figure 14:
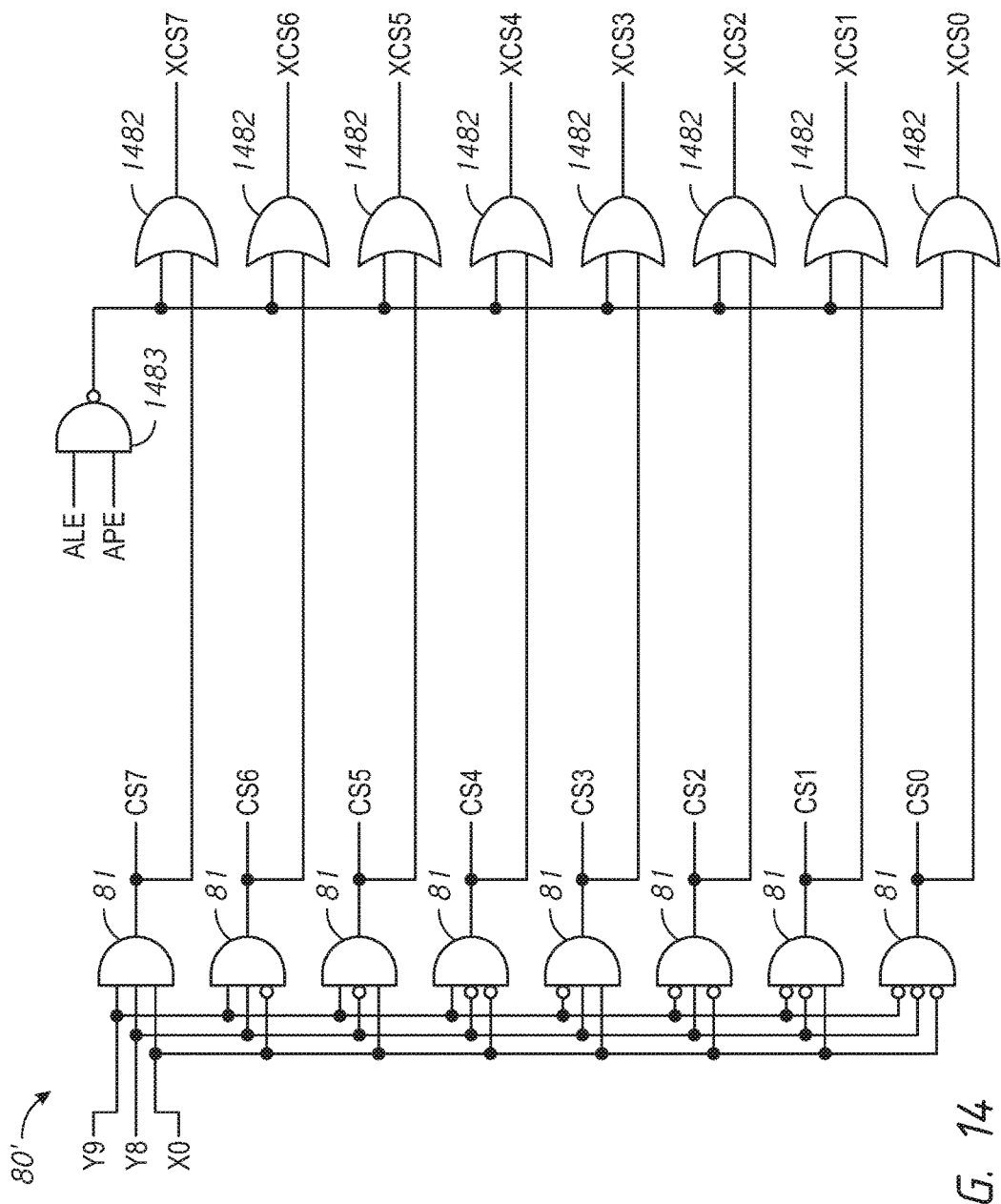
FIG. 14 is a circuit diagram of a column segment selection signal decoder in the column segment selection signal generator circuit, in accordance with an embodiment of the present disclosure.

FIG. 14 is a circuit diagram of a column segment selection signal decoder in the column segment selection signal generator circuit, in accordance with an embodiment of the present disclosure, For example, a column segment selection signal decoder 80' of FIG. 14 may include logic circuits 81, therefore the description thereof will be omitted. The column segment selection signal decoder 80' may further include selector circuits 1482 and a select control circuit 1483. For example, the select control circuit 1483 may be a NAND gate. The select control circuit 1483 may receive an additive latency enabled signal ALE and an auto precharge enabled signal APE as input signals. The additive latency enabled signal ALE may be active (e.g., a logic high level) when the additive latency AL is set in a mode register, such as the mode register MR1 53 of FIG. 13. The auto precharge enabled signal APE may be active (e.g., the logic high level) responsive to read/write commands with auto-precharge enabled. In this embodiment, the column segment signals CS7 to CS0 may be provided to the selector circuits 1482. Thus, the select control circuit 1483 provides an active signal (e.g., a logic low level) responsive to the active ALE and APE signals. The selector circuits 1482 may be OR gates which provides signals XCS7 to XCS0 in place of the column segment signals CS7 to CS0 from the column segment selection signal generation circuit 65 in FIG. 6. The selector circuits 1482 provides the column segment signals CS0 to CS7 as signals XCS7 to XCS0 to the circuit diagram of column segments in FIG. 10, when the active latency is set and the read/write command with auto-precharge enabled is being executed. If at least one of the ALE and APE signals is set inactive (e.g., the logic low level), all the signals XCS7 to XCS0 may be set to active (e.g., the logic high level). Thus, column segment control within each block using the column segment signals CS0 to CS7 in FIG. 10 may be disabled. Consequently, sub word lines may be selected and corresponding sense amplifiers may be activated in each block.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus comprising a decoder circuit configured to receive control information and a plurality of input signal and further configured to provide a plurality of decoded signals,
   wherein the decoder circuit is configured to, when the control information is indicative of a first state based on an additive latency enable signal and an auto precharge enabled signal, activate one of the decoded signals responsive to the plurality of input signals, and to, when the control information is indicative of a second state based on the additive latency enable signal and the auto precharge enabled signal, activate each of the plurality of decoded signals irrespective of the plurality of input signals.

2. The apparatus of claim 1, wherein the control information is responsive to at least the additive latency enable signal.

3. The apparatus of claim 1, wherein the control information is responsive to at least the auto precharge enabled signal.

4. The apparatus of claim 1, wherein the control information is responsive to at least a combination of the additive latency enable signal and the auto precharge enabled signal.

5. The apparatus of claim 4, wherein the control information is indicative of the second state when at least one of the additive latency enable signal and the auto precharge enabled signal is not asserted.

6. The apparatus of claim 5, wherein the control information is indicative of the first state when both the additive latency enable signal and the auto precharge enabled signal are asserted.

7. The apparatus of claim 1, wherein the plurality of input signals comprises a portion of column address signals and a portion of row address signals.

8. The apparatus of claim 1, the apparatus further comprising:
   a plurality of sub word drivers, wherein each of the sub word drivers is configured to receive a corresponding one of the plurality of decoded signals and further configured to be activated responsive, at least in part, to the corresponding one of the plurality of input signals being activated.

9. An apparatus comprising a decoder circuit configured to receive control information and a plurality of input signal and further configured to provide a plurality of decoded signals,
   wherein the decoder circuit is configured to, when the control information is indicative of a first state, activate one of the decoded signals responsive to the plurality of input signals, and to, when the control information is indicative of a second state, activate each of the plurality of decoded signals irrespective of the plurality of input signals, wherein the decoder circuit comprises:
   a decoding circuit configured to receive the plurality of input signals and outputting a plurality of intermediate decoded signals, further configured to activate one of the intermediate decoded signals and to deactivate remaining ones of the intermediate decoded signals responsive to the plurality of input signals; and
   a gate circuit configured to receive the plurality of intermediate decoded signals, the gate circuit configured to pass the intermediate decoded signal therethrough as the plurality of decoded signals, when the control information is indicative of the first state, and further configured to activate each of the decoded signals irrespective of the plurality of intermediate decoded signals, when the control information is indicative of the second state.

10. The apparatus of claim 9,
wherein the apparatus further comprises a plurality of functional circuits configured to receive the plurality of decoded signals, respectively, and
wherein each of the plurality of functional circuits is configured to be activated in response, at least in part, to an associated one of the decoded signals being activated.

11. The apparatus of claim 10,
wherein the plurality of input signals is a set of address signals; and
wherein each of the functional circuits comprises a word line driver.

12. The apparatus of claim 11,
wherein the set of address signals comprises at least one row address signal and at least one column address signal.

13. The apparatus of claim 9,
wherein the control information is produced based on at least two control signals,
wherein the control information is indicative of the second state when at least one of the at least two control signals is at a first logic level, and
wherein the control information is indicative of the first state when each of the at least two control signals is at a second logic level.

14. An apparatus comprising a decoder circuit, the decoder circuit comprising:
a plurality of logic circuits, each logic circuit of the plurality of logic circuits configured to receive a portion of row address signals and a portion of column address signals, and the plurality of logic circuits configured to provide a plurality of first output signals comprising an active signal and a plurality of inactive signals;
a control circuit configured to be responsive to a plurality of control signals and output a control signal; and
a plurality of selector circuits, each selector circuit of the plurality of selector circuits configured to receive a corresponding one of the plurality of first output signals, the plurality of selector circuits configured to provide a plurality of second output signals comprising the active signal and the plurality of inactive signals when the control signal is at a first logic level and further configured to provide the plurality of second output signals comprising a plurality of active signals when the control signal is at a second logic level.

15. The apparatus of claim 14, wherein the control signal includes an additive latency enable signal.

16. The apparatus of claim 14, wherein the control signal includes an auto precharge enabled signal.

17. The apparatus of claim 14, wherein the control signal is a combination of an additive latency enable signal and the auto precharge enabled signal.

18. The apparatus of claim 17, wherein the control signal is set to the second logic level when at least one of the additive latency enable signal and the auto precharge enabled signal is inactive.

19. The apparatus of claim 18, wherein the control signal is set to the first logic level when both the additive latency enable signal and the auto precharge enabled signal are active.

20. The apparatus of claim 14, the apparatus further comprising:
a plurality of sub word drivers, each sub word driver of the plurality of sub word drivers configured to receive a corresponding second output signal of the plurality of second output signals,
wherein each sub word driver of the plurality of sub word drivers is activated responsive to the corresponding second output signal in an active state, and
wherein each sub word driver of the plurality of sub word drivers is deactivated responsive to the corresponding second output signal in an inactive state.

* * * * *